(12) United States Patent
Xia et al.

(10) Patent No.: US 11,402,952 B2
(45) Date of Patent: Aug. 2, 2022

(54) METHOD AND CIRCUIT FOR OBTAINING CAPACITIVE FEEDBACK SIGNAL OF CAPACITIVE FEEDBACK-TYPE MICRO TORSION MIRROR

(71) Applicant: XI AN ZHISENSOR TECHNOLOGIES CO., LTD., Xi'an (CN)

(72) Inventors: Changfeng Xia, Xi'an (CN); Wenhui Zheng, Xi'an (CN); Xiumin Song, Xi'an (CN); Qiaoming You, Xi'an (CN); Dayong Qiao, Xi'an (CN)

(73) Assignee: XI AN ZHISENSOR TECHNOLOGIES CO., LTD., Xi'an (CN)

( * ) Notice: Subject to any disclaimer, the term of this patent is extended or adjusted under 35 U.S.C. 154(b) by 0 days.

(21) Appl. No.: 17/419,552

(22) PCT Filed: Apr. 20, 2020

(86) PCT No.: PCT/CN2020/085705
§ 371 (c)(1),
(2) Date: Jun. 29, 2021

(87) PCT Pub. No.: WO2020/221045
PCT Pub. Date: Nov. 5, 2020

(65) Prior Publication Data
US 2022/0075465 A1    Mar. 10, 2022

(30) Foreign Application Priority Data

Apr. 29, 2019 (CN) .................. 201910355532.X

(51) Int. Cl.
*G06F 3/044* (2006.01)
*G06F 3/041* (2006.01)
*G06F 3/042* (2006.01)

(52) U.S. Cl.
CPC .............. *G06F 3/044* (2013.01); *G06F 3/042* (2013.01); *G06F 3/0418* (2013.01)

(58) Field of Classification Search
CPC ........ G06F 3/0418; G06F 3/042; G06F 3/044; G06F 2115/04; G09G 3/346
See application file for complete search history.

(56) References Cited

U.S. PATENT DOCUMENTS

| 2009/0245299 A1* | 10/2009 | Stern ................... G02B 26/0841 372/24 |
| 2010/0060966 A1* | 3/2010 | Cheong .............. G02B 26/0858 359/221.2 |

(Continued)

FOREIGN PATENT DOCUMENTS

| CN | 101674030 A | 3/2010 |
| CN | 101981487 A | 2/2011 |

(Continued)

OTHER PUBLICATIONS

International Search Report (ISR) for PCT/CN2020/085705 dated Jul. 24, 2020 (8 pages).

(Continued)

*Primary Examiner* — Michael Pervan
(74) *Attorney, Agent, or Firm* — Shumaker, Loop & Kendrick, LLP

(57) ABSTRACT

A method and circuit for obtaining a capacitive feedback signal of a capacitive feedback micro torsion mirror are provided to solve the problem of poor stability of the capacitive feedback signals of the micro torsion mirror. First, a pulse signal is used as a driving signal to drive the capacitive feedback micro torsion mirror to vibrate; it is ensured that the micro torsion mirror may twist freely for at least 0.5 cycles during an interval of two adjacent sets of driving pulses; secondly, the capacitive feedback signal of the capacitive feedback micro torsion mirror is extracted, (Continued)

and converted into a voltage signal; then, the voltage signal is amplified; and finally extracted during the interval of the two adjacent sets of driving pulses, and taken as a real capacitive feedback signal. A carrier generation circuit and a detection circuit are omitted, and the influence of the carrier generation circuit and the detection circuit on a capacitive feedback signal is eliminated. The circuit is more concise and the stability of the capacitive feedback signal is improved. Further, a specific driving form and signal extraction manner are used to obtain the real capacitive feedback signal.

14 Claims, 3 Drawing Sheets

(56) References Cited

U.S. PATENT DOCUMENTS

| | | | | |
|---|---|---|---|---|
| 2011/0115729 | A1* | 5/2011 | Kremin | G06F 3/04182 |
| | | | | 345/173 |
| 2011/0222067 | A1* | 9/2011 | Saadany | G02B 26/0841 |
| | | | | 356/450 |
| 2011/0320046 | A1 | 12/2011 | Drouin et al. | |
| 2015/0205438 | A1* | 7/2015 | Kremin | G06F 3/04184 |
| | | | | 345/174 |
| 2015/0316762 | A1* | 11/2015 | Hambeck | G02B 26/085 |
| | | | | 359/199.1 |
| 2016/0231172 | A1* | 8/2016 | Medhat | G02B 26/0841 |
| 2018/0157030 | A1 | 6/2018 | Vigna et al. | |

FOREIGN PATENT DOCUMENTS

| | | |
|---|---|---|
| CN | 102077217 A | 5/2011 |
| CN | 102725715 A | 10/2012 |
| CN | 102834764 A | 12/2012 |
| CN | 104216112 A | 12/2014 |
| CN | 107078723 A | 8/2017 |
| CN | 107450178 A | 12/2017 |
| CN | 107490857 A | 12/2017 |
| CN | 108388169 A | 8/2018 |
| CN | 108474690 A | 8/2018 |
| CN | 110333598 A | 10/2019 |
| EP | 2940509 A1 | 11/2015 |

OTHER PUBLICATIONS

Written Opinion for PCT/CN2020/085705 dated Jul. 24, 2020 (9 pages).

* cited by examiner

Sinusoidal pulse driving signal

N1 pulses    N2 pulses    N3 pulses

Half-sinusoidal pulse driving signal

N1 pulses    N2 pulses    N3 pulses

METHOD AND CIRCUIT FOR OBTAINING CAPACITIVE FEEDBACK SIGNAL OF CAPACITIVE FEEDBACK-TYPE MICRO TORSION MIRROR

TECHNICAL FIELD

The present invention relates to the field of micro-opto-electro-mechanical systems (MOEMS), and in particular to a method and circuit for obtaining a capacitive feedback signal of a capacitive feedback micro torsion mirror.

BACKGROUND

Generally, driving signals of an electrostatic comb teeth driven micro torsion mirror are PFM (pulse frequency modulation) signals with amplitudes of dozens to hundreds of volts with a duty ratio of 50%.

For improved capacitive feedback signals of a capacitive feedback micro torsion mirror, as shown in FIG. 2, high frequency carrier signals are applied on the movable comb teeth of the micro torsion mirror, and resulting capacitive feedback signals are processed by a detector circuit to extract real capacitance signals, which are then amplified by an amplifier for ease of identification and processing. However, carrier generation circuit and detector circuit have inadequate stability as they are complicated and extremely susceptible to signal jitter or drift due to factors such as environment and temperature.

SUMMARY

In order to solve the problem of low stability of capacitive feedback signals of a micro torsion mirror, the present invention provides a new method and circuit for obtaining capacitive feedback signals of the capacitive feedback micro torsion mirror. Capacitive feedback signal of the micro torsion mirror with improved stability can be obtained through the method and system.

By analyzing factors that affect the stability of capacitive feedback signals of a micro torsion mirror, it is discovered that, if high frequency carrier signals are not superimposed on movable comb teeth of a micro torsion mirror, there is no need for carrier generation circuit and detection circuit. The post-processing circuit is thus simplified and stability of the circuit is improved.

However, the following facts are observed in experiments. The feedback capacitance variation of a micro torsion mirror is so small that once cross interference from driving signals is introduced, capacitive signals would be almost submerged by the interference signals. As a result, real capacitive feedback signals cannot be extracted. Therefore, to obtain real capacitive feedback signals, interference of driving signals to capacitive feedback signals has to be eliminated. In view of this, the present invention proposes the following technical solutions.

A method for obtaining a capacitive feedback signal of a capacitive feedback micro torsion mirror, comprising:

S1: using pulse signals as driving signals to drive a capacitive feedback micro torsion mirror to vibrate; ensuring free torsion of the micro torsion mirror for at least 0.5 cycles during the interval of two sets of adjacent driving pulses;

S2: extracting a capacitive feedback signal of the capacitive feedback micro torsion mirror, and converting the capacitive feedback signal into a voltage signal;

S3: amplifying the voltage signal obtained in S2; and

S4: extracting the amplified voltage signal as a real capacitive feedback signal during the interval of two sets of adjacent driving pulses.

Further, S4 is implemented by:

starting capture of the amplified voltage signal after a preset period t since the emission of a set of driving pulses, and stopping the capture before the emission of a subsequent set of driving pulses, wherein the period t is greater than or equal to a duration of an interference signal actually observed.

Further, S4 can also be implemented by:

converting the voltage signal into a digital signal using an analog-to-digital conversion circuit and outputting the digital signal to a processor, which starts processing of the digital signal after a preset period t since the emission of a set of driving pulses and stops the processing before the emission of a subsequent set of driving pulses, wherein the period t is greater than or equal to a duration of an interference signal actually observed.

Further, S4 can also be implemented by:

after a preset period t since the emission of a set of driving pulses, using a switch to allow the passage of the amplified voltage signal until a subsequent set of driving pulses is emitted, upon which the switch is turned off such that the amplified voltage signal is not allowed to pass, wherein the period t is greater than or equal to a duration of an interference signal actually observed.

Further, the pulse signals in S1 are pulse width modulation signals with a duty ratio of 1%-50%.

Further, the duty cycle of the pulse width modulation signals is 10%.

Further, the pulse signals in S1 are N sets of pulse signals with adjustable pulse width and frequency, each of the sets of pulse signals includes at least one pulse, wherein N is any positive integer, and each set of pulse signals with adjustable pulse width and frequency is used as a set of driving signals.

Further, the pulse signals with adjustable pulse width and frequency are sinusoidal pulses or half-sinusoidal pulses.

Further, the driving signals are respectively applied to two sides of a torsion beam of the micro torsion mirror, and the phase difference between the driving signals on the two sides is 180 degrees.

Further, the pulse signals have pulses at a high level and intervals at a fixed low level.

Further, the pulse signals have pulses at a low level and intervals at a fixed high level.

Further, the driving signals drive all comb tooth pairs of the micro torsion mirror, and capacitive feedback signals are extracted from all the comb tooth pairs of the micro torsion mirror for feeding back capacitance variation.

The present invention also provides a driving circuit of the capacitive feedback micro torsion mirror for implementing the above method, comprising a driving signal source, a capacitance detection circuit, an amplifier circuit and a signal extraction circuit.

The driving signal source has an output terminal connected to driving comb teeth of the capacitive feedback micro torsion mirror, so as to send driving signals to drive the capacitive feedback micro torsion mirror to vibrate.

The capacitance detection circuit has an input terminal connected to capacitive feedback comb teeth of the capacitive feedback micro torsion mirror, converts a capacitive signal into a voltage signal, and has an output terminal connected to an input terminal of the amplifier circuit, an output terminal of which is connected to an input terminal of the signal extraction circuit; and the signal extraction circuit extracts an amplified voltage signal during an interval of two adjacent sets of driving pulses.

Further, the signal extraction circuit comprises a processor, which starts capture of the amplified voltage signal after a preset period t since the emission of a set of driving pulses, and stops the capture before the emission of a subsequent set of driving pulses, wherein the period t is greater than or equal to a duration of an interference signal actually observed;

or the signal extraction circuit comprises an analog-to-digital conversion circuit and a processor, the analog-to-digital conversion circuit collects an amplified voltage value derived from the capacitor feedback signal, and converts the voltage value into a digital signal format and outputs the digital signal to the processor; the processor starts processing of the digital signal after a preset period t since the emission of a set of driving pulses, and stops the processing before the emission of a subsequent set of driving pulses; wherein the period t is greater than or equal to a duration of an interference signal actually observed;

or the signal extraction circuit comprises a processor and a switch; the processor controls the switch to close, after a preset period t since the emission of a set of driving pulses, to allow the passage of the amplified voltage signal until a subsequent set of driving pulses is emitted, upon which the processor turns off the switch such that passage of the amplified voltage signal is denied, wherein the period t is greater than or equal to a duration of an interference signal actually observed.

Compared with the prior art, the present invention has at least the following beneficial effects:

1. In the process of obtaining capacitive feedback signals of a capacitive feedback micro torsion mirror, high-frequency carrier signals are canceled and capacitive feedback signals are directly extracted from post-amplification. A carrier generation circuit and a detection circuit are omitted. Influence of the carrier generation and detection circuits on capacitive feedback signals is thus eliminated. The circuit is simplified and stability of capacitive feedback signals is improved. Further, a specific driving form and a signal extraction manner are used to obtain the real capacitive feedback signals.

2. In order to deal with the interference of rapid transitions of driving signals on capacitive feedback signals, the present invention uses specific pulse driving signals to drive the capacitive feedback micro torsion mirror, and extracts capacitive feedback signals during intervals of driving signal pulses. In intervals, capacitive feedback signals are not interfered by rapid transitions of driving signals, such that real capacitive feedback signal can be obtained. Capacitive signals fed back during free torsion of the micro torsion mirror are used as real feedback capacitive signals, and interference from driving signals is eliminated. This is implemented by by selecting pulse signals of various forms and strategical utilization of pulse intervals. The concept is ingenious, and the process is convenient and simple.

3. The present invention can be applied to various pulse driving signals, such as pulse width modulation (PWM) signals, pulse width modulation+pulse frequency modulation (PWM+PFM) signals, sinusoidal signals, half-sinusoidal signals, and the like.

The reference numbers in drawings are: 1—movable mirror surface, 2—fixed frame, 3—comb tooth pair, 31—static comb teeth and 32—movable comb teeth.

DETAILED DESCRIPTION

Figure 1:
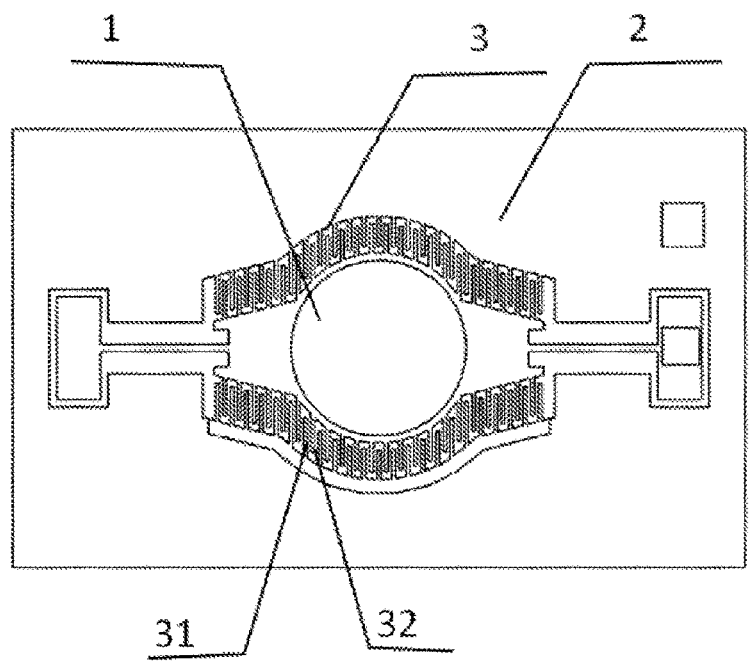
FIG. 1 is a mechanical diagram of a micro torsion mirror.
Figure 2:
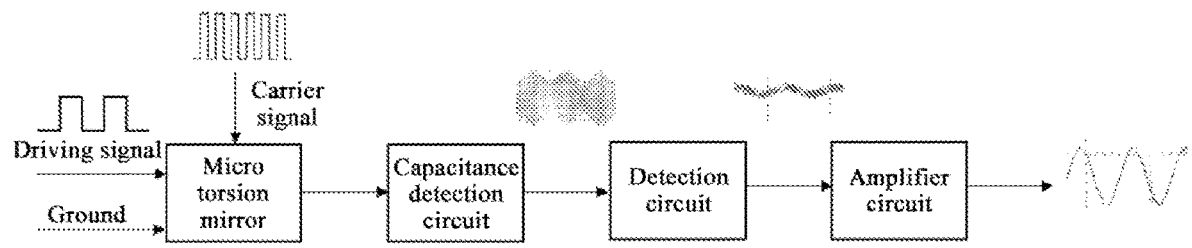
FIG. 2 is a structure of the driving and feedback circuit of an existing capacitive feedback micro torsion mirror.

The invention provides a method for obtaining a capacitive feedback signal of a capacitive feedback micro torsion mirror and a circuit, so as to obtain a stable and real capacitive feedback signal to determine the vibration angle of the micro torsion mirror. FIG. 1 illustrates a capacitive feedback micro torsion mirror including a movable mirror 1 and a fixed frame 2. A number of comb tooth pairs 3 are distributed at the junction of the movable mirror 1 and the fixed frame 2. The comb teeth on the side of the movable mirror are referred to as movable comb teeth 32, and the comb teeth on the side of the fixed frame are referred to as static comb teeth 31. The comb tooth pairs may be distributed at any position between the movable mirror 1 and the fixed frame 2.

The driving and feedback of the micro torsion mirror may be as follow. A part of the comb tooth pairs is used for driving the micro torsion mirror to vibrate, and the other part of the comb tooth pairs is used for feeding back the capacitance variation. That is, driving signals drive a part of comb tooth pairs of the micro torsion mirror, while capacitive feedback signals are extracted from the other part of comb teeth of the micro torsion mirror to feedback capacitance variation.

The driving and feedback manner of the micro torsion mirror may also be: all the comb tooth pairs are used for driving the micro torsion mirror to vibrate and feeding back the capacitance variation. That is, driving signals drives all the comb tooth pairs of the micro torsion mirror, and capacitive feedback signals are extracted from all the comb tooth pairs of the micro torsion mirror to feedback capacitance variation. The more the comb tooth pairs are driven, the greater the capacitance variation generated when the micro torsion mirror is twisted, the higher the signal-to-noise ratio, and the more accurate the feedback.

In the present invention, any kind of pulse signals can be used as driving signals to drive the capacitive feedback micro torsion mirror to operate. Capacitive feedback signals of the capacitive feedback micro torsion mirror are then extracted, and converted into a voltage signal and amplified. The amplified voltage signal is extracted as a real capacitive feedback signal during the interval of two adjacent sets of driving pulses. Capacitive feedback signals during pulse intervals are strategically extracted as real feedback capacitance signals. The pulse signals taken as driving signals may be in various forms, such as pulse width modulation (PWM) signals, pulse width modulation+pulse frequency modulation (PWM+PFM) signals, sinusoidal signals, half-sinusoidal signals, and the like. Regardless of pulse signal forms, a certain interval between two adjacent driving signals shall be ensured. During the intervals, no driving signal is present, but the micro torsion mirror is free of torsion. The interval has a length that allows at least one acquisition of a complete capacitive feedback signal, i.e. the micro torsion mirror is in free torsion state for at least half a cycle.

The present invention is described in detail below with reference to the drawings and specific embodiments.

Embodiment 1

Figure 3:
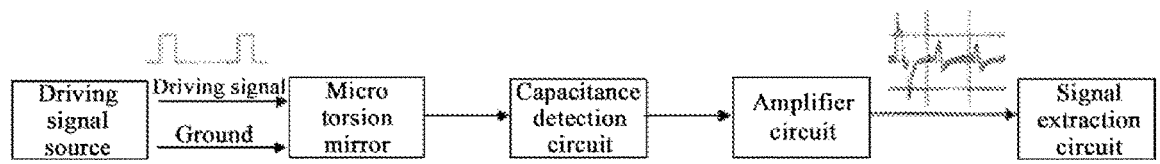
FIG. 3 is a structure of the driving and feedback circuit of the micro torsion mirror according to the present invention.

As can be seen from FIG. 3, the circuit for obtaining the capacitive feedback signal in this embodiment includes a driving signal source, a capacitance detection circuit, a signal amplifier circuit, and a signal extraction circuit. The driving signals output by the driving signal source are PWM (pulse width modulation) signals, which may have a duty ratio range of 1%-50%. The duty ratio is of 10% is selected in this embodiment for a larger vibration angle and more samples.

The driving signals are applied to a static comb tooth side and/or a movable comb tooth side of the micro torsion mirror for driving, and are swept until the micro torsion mirror operates in a stable vibration state. The capacitance detection circuit is connected to the static comb teeth of the micro torsion mirror for capacitive feedback, and converts weak capacitance signals fed back by the micro torsion mirror into voltage signals. The capacitance detection circuit is preferably a voltage feedback operational amplifier circuit for detecting a minute capacitance variation and reflecting it through a change in output voltages. The capacitance detection circuit may also be in any other form, such as an integrated capacitance detection chip. The voltages output by the capacitance detection circuit are difficult to measure due to small amplitudes and large noise. As such, signal amplification is needed. An output terminal of the capacitance detection circuit is connected to an input terminal of the amplifier circuit to amplify the voltages output from the capacitance detection circuit. The amplifier circuit is preferably a voltage feedback operational amplifier circuit, having a signal amplification factor set according to requirements. Through analysis of the relationship between amplified feedback signals and driving signals, real capacitive feedback signals are extracted by using a signal extraction circuit.

Specifically, extraction of the real capacitive feedback signals is described below.

Figure 4:
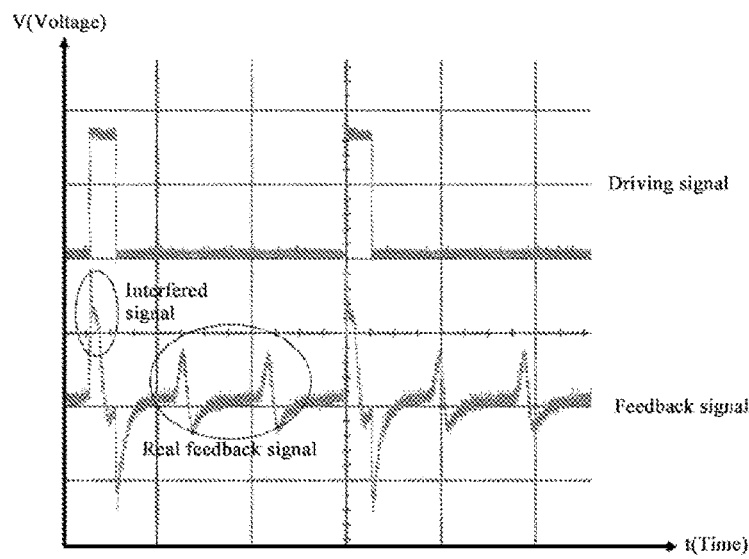
FIG. 4 is a waveform diagram of a driving signal and a capacitive feedback signal (amplified)

As can be seen from FIG. 4, when the micro torsion mirror is driven by driving signals with a duty ratio of 10%, 3 peak values of capacitive feedback signals can be observed in one driving cycle. The number of peaks also relates to the resonant frequency of the micro torsion mirror. That is, the micro torsion mirror returns to the position of the maximum capacitance three times in a driving cycle, and the micro torsion mirror vibrates for 1.5 cycles. In the prior art, square wave driving signals with a duty ratio of 50% are used. In this case, the micro torsion mirror with the same resonant frequency vibrates for 0.5 cycles in a driving signal cycle. In FIG. 4, pulse signals are used as driving signals. The pulse signals have pulses at a high level and intervals at a fixed low level. The phase of the driving signals may be inverted by 180°, i.e. the pulse signals have pulses at a low level and intervals at a fixed high level. The fixed high and low voltage levels may be fixed voltage values of any amplitude. From results of experiments, the higher the level during the pulse interval, the greater the capacitance variation generated when the micro torsion mirror is twisted, the higher the signal-to-noise ratio, and the more accurate the feedback.

In FIG. 4, among the three peaks of capacitive feedback values obtained in a driving cycle, one has the highest amplitude, and the other two are lower and almost at the same level. It is obvious from the figure that the starting point of the highest peak value is consistent with the starting point of the transition of the driving signal. This highest feedback peak is considered as superposition of the real capacitive feedback and interference from the driving signal interference, and thus cannot reflect the real capacitance variation. The subsequent two peaks with the same level are not interfered by superimposing driving signals, and is thereby regarded as an amplified voltage of a real capacitive feedback signal. From amplitude of the amplified voltage, the vibration angle of the micro torsion mirror is determined. Therefore, the signal extraction circuit extracts voltages that are not interfered by superimposing driving signals as real capacitive feedback signals.

The extraction of the real capacitive feedback signal can be realized by, but not limited to, the following manners.

1. Regular capture by a processor. The processor starts capture of signals after a preset period t since the emission of a driving pulse, and stops the capture before the emission of a subsequent driving pulse. The processor chip may be of any type, such as a single-chip microcomputer of STM32 series. The single-chip microcomputer of STM32 series starts to capture amplified voltages after a preset period t since the emission of a driving pulse. The current angle of the micro torsion mirror is determined according to magnitudes of the amplified voltages. The capture is stopped before the subsequent driving pulse is emitted. The period t is greater than or equal to the duration of an actually measured interference signal, so as to ensure that interference signals are removed while real capacitive feedback signals are collected.

2. Analog-to-digital conversion method. The analog-to-digital conversion chip may be an ADS7868, 8 bit analog-digital conversion chip. Amplified voltages of capacitive feedback signals are used as analog input signals of the ADS7868, and are converted into digital form signals, and then output to the processor. The processor starts to process the digital signals after a preset period t since the emission of a driving pulse and stops the processing before the emission of a subsequent driving pulse. The period t is greater than or equal to a duration of an interference signal actually measured, so as to ensure that the interference signals are removed while real capacitive feedback signals are obtained.

3. Switching method. After a driving pulse is emitted, the switch is turned on to allow the passage of capacitive feedback signals. Before a subsequent driving pulse is emitted, the switch is turned off That is, the switch is in an off state during the emission of the driving pulse, and the passage of signals are denied. In this way, real capacitive feedback signals are retained. The switching device may be an integrated chip, such as a TC7USB31FK switch chip of Toshiba; or a discrete semiconductor device such as a triode, a MOSFET and the like. The on-off of the switch is controlled by the ordinary GPIO of the processor.

Embodiment 2

Figure 5:
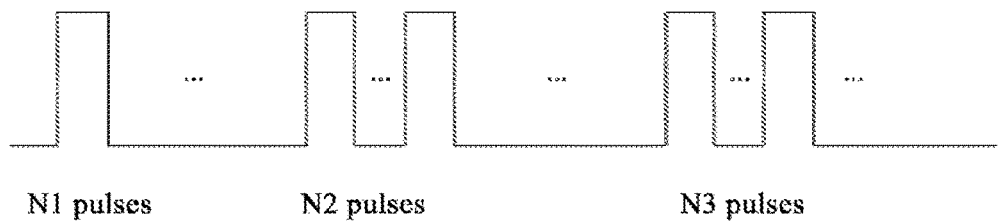
FIG. 5 illustrates an exemplary waveform driving signal (PWM+PFM)

Referring to FIG. 5, the difference from the Embodiment 1 is that driving signals in this embodiment are pulse width modulation+pulse frequency modulation (PWM+PFM) signals. The circuit for obtaining the capacitive feedback signal in this embodiment includes: a driving signal source, a capacitance detection circuit, a signal amplifier circuit and a signal extraction circuit. Driving signals output by the driving signal source may be in any form of PWM+PFM signals and are applied to the side of the static comb teeth for driving.

The driving signals in FIG. 5 comprise N sets of PWM+PFM signals, where N is any positive integer. The first set contains N1 pulse signals, the second set contains N2 pulse signals, the third set contains N3 pulse signals, and the Nth set contains NX pulse signals. N1, N2, N3 and NX may be equal or unequal. There are enough intervals between adjacent pulse sets to ensure that at least one maximum value of capacitive feedback signals can be received during the interval wherein the capacitive feedback signal is not interfered by the rapid transition of the driving signals and thus reflects the real capacitive feedback signal. The capacitive feedback signals are converted into voltage signals via the detection circuit and the amplifier circuit. The voltage signals contain capacitive feedback signals superimposed with driving signal interference and capacitive feedback signals free of driving signal interferences. Real capacitive feedback signal are extracted by the signal extraction circuit.

In order to obtain real capacitive feedback signals free of interference, capacitive feedback signals have to be extracted according to the signal form of the driving pulses. In this embodiment, capacitive feedback signals are extracted during intervals between sets of pulses.

The extraction of the real capacitive feedback signal in this embodiment may be implemented by, but not limited to, the following manners.

1. Regular capture by a processor. The processor starts capture of signals after a preset period t since the emission of a driving pulse, and stops the capture before the emission of a subsequent driving pulse. The processor chip may be of any type, such as a single-chip microcomputer of STM32 series. The single-chip microcomputer of STM32 series starts to capture amplified voltages after a preset period t since the emission of a driving pulse. The current angle of the micro torsion mirror is determined according to magnitudes of the amplified voltages. The capture is stopped before the subsequent driving pulse is emitted. The period t is greater than or equal to the duration of an actually measured interference signal, so as to ensure that interference signals are removed while real capacitive feedback signals are collected.

2. Analog-to-digital conversion method. The analog-to-digital conversion chip may be an ADS7868, 8 bit analog-digital conversion chip. Amplified voltages of capacitive feedback signals are used as analog input signals of the ADS7868, and are converted into digital form signals, and then output to the processor. The processor starts to process the digital signals after a preset period t since the emission of a driving pulse and stops the processing before the emission of a subsequent driving pulse. The period t is greater than or equal to a duration of an interference signal actually measured, so as to ensure that the interference signals are removed while real capacitive feedback signals are obtained.

3. Switching method. After a driving pulse is emitted, the switch is turned on to allow the passage of capacitive feedback signals. Before a subsequent driving pulse is emitted, the switch is turned off That is, the switch is in an off state during the emission of the driving pulse, and the passage of signals are denied. In this way, real capacitive feedback signals are retained. The switching device may be an integrated chip, such as a TC7USB31FK switch chip of Toshiba; or a discrete semiconductor device such as a triode, a MOSFET and the like. The on-off of the switch is controlled by the ordinary GPIO of the processor.

Embodiment 3

Figure 6:
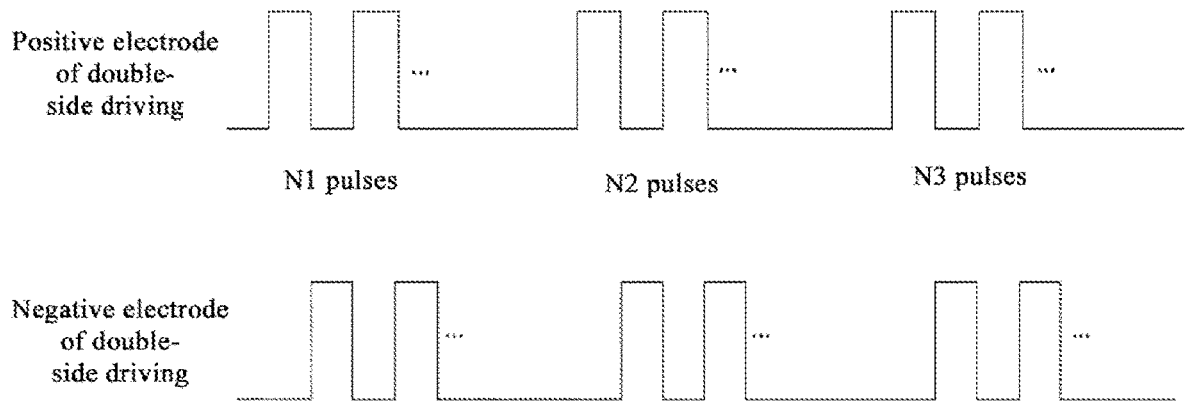
FIG. 6 illustrates double-side driving signals.

In this embodiment, a method for driving a micro torsion mirror with any double-side signal and a method for extracting a capacitive feedback signal are provided, and the driving signal is preferably PWM+PFM (pulse width modulation+pulse frequency modulation), see FIG. 6. It relates to a double-side driving manner, wherein driving signals are applied to two sides of a torsion beam of the micro torsion mirror respectively, and the phase difference of the driving signals at the two sides is 180 degrees during the continuous emission of driving pulses.

The work system includes: a driving signal source, a capacitance detection circuit, a signal amplifier circuit, and a signal extraction circuit. The driving signal is any form of PWM+PFM signal and is applied to comb teeth on two sides of the micro torsion mirror for driving. The positive driving signal in FIG. 6 is in the form of N sets of PWM+PFM signals, wherein N is any positive integer. The first set contains N1 pulse signals, the second set contains N2 pulse signals, the third set contains N3 pulse signals, and the Nth set contains NX pulse signals. N1, N2, N3 and NX can be equal or unequal. There are enough intervals between adjacent pulse sets to ensure that at least one maximum value of capacitive feedback signals can be received during the interval wherein the capacitive feedback signal is not interfered by the rapid transition of the driving signals and thus reflects the real capacitive feedback signal. The negative driving signal is in the form of N sets of PWM+PFM signals, the phase of which is 180 degrees apart from the positive driving signal during the continuous emission of driving pulses, and kept at 0 potential during the interval of pulse sets. The capacitive feedback signals are converted into voltage signals via the detection circuit and the amplifier circuit. The voltage signals contain capacitive feedback signals superimposed with driving signal interference and capacitive feedback signals free of driving signal interferences.

In order to obtain real capacitive feedback signals free of interference, capacitive feedback signals have to be extracted according to the signal form of the driving pulses during intervals between sets of pulses.

The extraction manner may be implemented by, but not limited to, the following manners.

1. Regular capture by a processor. The processor starts capture of signals after a preset period t since the emission of a driving pulse, and stops the capture before the emission of a subsequent driving pulse. The processor chip may be of any type, such as a single-chip microcomputer of STM32 series. The single-chip microcomputer of STM32 series starts to capture amplified voltages after a preset period t since the emission of a driving pulse. The current angle of the micro torsion mirror is determined according to magnitudes of the amplified voltages. The capture is stopped before the subsequent driving pulse is emitted. The period t is greater than or equal to the duration of an actually measured interference signal, so as to ensure that interference signals are removed while real capacitive feedback signals are collected.

2. Analog-to-digital conversion method. The analog-to-digital conversion chip may be an ADS7868, 8 bit analog-digital conversion chip. Amplified voltages of capacitive feedback signals are used as analog input signals of the ADS7868, and are converted into digital form signals, and then output to the processor. The processor starts to process the digital signals after a preset period t since the emission of a driving pulse and stops the processing before the emission of a subsequent driving pulse. The period t is greater than or equal to a duration of an interference signal actually measured, so as to ensure that the interference signals are removed while real capacitive feedback signals are obtained.

3. Switching method. After a driving pulse is emitted, the switch is turned on to allow the passage of capacitive feedback signals. Before a subsequent driving pulse is emitted, the switch is turned off That is, the switch is in an off state during the emission of the driving pulse, and the passage of signals are denied. In this way, real capacitive feedback signals are retained. The switching device may be an integrated chip, such as a TC7USB31FK switch chip of Toshiba; or a discrete semiconductor device such as a triode, a MOSFET and the like. The on-off of the switch is controlled by the ordinary GPIO of the processor.

Embodiment 4

Figure 7:
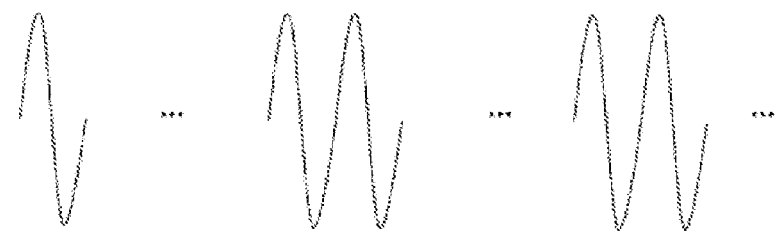
FIG. 7 illustrates sinusoidal pulse driving signals.
Figure 8:
FIG. 8 illustrates half-sinusoidal pulse driving signals.

This embodiment provides a method for driving a micro torsion mirror through sinusoidal pulse or half-sinusoidal pulse signals and a method for extracting a capacitive feedback signal, which are similar to Embodiment 2 except that the form of pulse waveform is sinusoidal pulse or half-sinusoidal, see FIGS. 7 and 8.

The work system includes: a driving signal source, a capacitance detection circuit, a signal amplifier circuit, and a signal extraction circuit. The driving signals are a set of sinusoidal or half-sinusoidal signals and are applied to the static comb teeth for driving. The driving signals in FIG. 7 are in form of N sets of sinusoidal pulse signals, the driving signals in FIG. 8 are in form of N sets of half sinusoidal pulse signals, wherein N is any positive integer. The first set contains N1 pulse signals, the second set contains N2 pulse signals, the third set contains N3 pulse signals, and the Nth set contains NX pulse signals. N1, N2, N3 and NX can be equal or unequal. There are enough intervals between adjacent pulse sets to ensure that at least one maximum value of capacitive feedback signals can be received during the interval wherein the capacitive feedback signal is not interfered by the rapid transition of the driving signals and thus reflects the real capacitive feedback signal. The capacitive feedback signals are converted into voltage signals via the detection circuit and the amplifier circuit. The voltage signals contain capacitive feedback signals superimposed with driving signal interference and capacitive feedback signals free of driving signal interferences. Real capacitive feedback signal are extracted by the signal extraction circuit.

In order to obtain a true non-interference capacitive feedback signal, capacitive feedback signals have to be extracted according to the signal form of the driving pulses during intervals between sets of pulses.

The extraction manner may be implemented by, but not limited to, the following manners.

1. Regular capture by a processor. The processor starts capture of signals after a preset period t since the emission of a driving pulse, and stops the capture before the emission of a subsequent driving pulse. The processor chip may be of any type, such as a single-chip microcomputer of STM32 series. The single-chip microcomputer of STM32 series starts to capture amplified voltages after a preset period t since the emission of a driving pulse. The current angle of the micro torsion mirror is determined according to magnitudes of the amplified voltages. The capture is stopped before the subsequent driving pulse is emitted. The period t is greater than or equal to the duration of an actually measured interference signal, so as to ensure that interference signals are removed while real capacitive feedback signals are collected.

2. Analog-to-digital conversion method. The analog-to-digital conversion chip may be an ADS7868, 8 bit analog-digital conversion chip. Amplified voltages of capacitive feedback signals are used as analog input signals of the ADS7868, and are converted into digital form signals, and then output to the processor. The processor starts to process the digital signals after a preset period t since the emission of a driving pulse and stops the processing before the emission of a subsequent driving pulse. The period t is greater than or equal to a duration of an interference signal actually measured, so as to ensure that the interference signals are removed while real capacitive feedback signals are obtained.

3. Switching method. After a driving pulse is emitted, the switch is turned on to allow the passage of capacitive feedback signals. Before a subsequent driving pulse is emitted, the switch is turned off That is, the switch is in an off state during the emission of the driving pulse, and the passage of signals is denied. In this way, real capacitive feedback signals are retained. The switching device may be an integrated chip, such as a TC7USB31FK switch chip of Toshiba; or a discrete semiconductor device such as a triode, a MOSFET and the like. The on-off of the switch is controlled by the ordinary GPIO of the processor.

What is claimed is:

1. A method for obtaining a capacitive feedback signal of a capacitive feedback micro torsion mirror, comprising:
   S1: using pulse signals as driving signals to drive a capacitive feedback micro torsion mirror to vibrate; ensuring free torsion of the micro torsion mirror for at least 0.5 cycles during the interval of two sets of adjacent driving pulses;
   S2: extracting a capacitive feedback signal of the capacitive feedback micro torsion mirror, and converting the capacitive feedback signal into a voltage signal;
   S3: amplifying the voltage signal obtained in S2; and
   S4: extracting the amplified voltage signal as a real capacitive feedback signal during the interval of two sets of adjacent driving pulses.

2. The method for obtaining a capacitive feedback signal of a capacitive feedback micro torsion mirror according to claim 1, wherein S4 is implemented by:
   starting capture of the amplified voltage signal after a preset period t since the emission of a set of driving pulses, and stopping the capture before the emission of a subsequent set of driving pulses, wherein the period t is greater than or equal to a duration of an interference signal actually observed.

3. The method for obtaining a capacitive feedback signal of a capacitive feedback micro torsion mirror according to claim 1, wherein S4 is implemented by:
   converting the voltage signal into a digital signal using an analog-to-digital conversion circuit and outputting the digital signal to a processor, which starts processing of the digital signal after a preset period t since the emission of a set of driving pulses and stops the processing before the emission of a subsequent set of driving pulses, wherein the period t is greater than or equal to a duration of an interference signal actually observed.

4. The method for obtaining a capacitive feedback signal of a capacitive feedback micro torsion mirror according to claim 1, wherein S4 is implemented by:

after a preset period t since the emission of a set of driving pulses, using a switch to allow the passage of the amplified voltage signal until a subsequent set of driving pulses is emitted, upon which the switch is turned off such that the amplified voltage signal is not allowed to pass, wherein the period t is greater than or equal to a duration of an interference signal actually observed.

5. The method for obtaining a capacitive feedback signal of a capacitive feedback micro torsion mirror according to claim 1, wherein,
the pulse signals in S1 are pulse width modulation signals with a duty ratio of 1%-50%.

6. The method for obtaining a capacitive feedback signal of a capacitive feedback micro torsion mirror according to claim 5, wherein,
the duty cycle of the pulse width modulation signals is 10%.

7. The method for obtaining a capacitive feedback signal of a capacitive feedback micro torsion mirror according to claim 1 wherein,
the pulse signals in S1 are N sets of pulse signals with adjustable pulse width and frequency, each of the sets of pulse signals includes at least one pulse, wherein N is any positive integer, and each set of pulse signals with adjustable pulse width and frequency is used as a set of driving signals.

8. The method for obtaining a capacitive feedback signal of a capacitive feedback micro torsion mirror according to claim 7, wherein, the pulse signals with adjustable pulse width and frequency are sinusoidal pulses or half-sinusoidal pulses.

9. The method for obtaining a capacitive feedback signal of a capacitive feedback micro torsion mirror according to claim 7, wherein, the driving signals are respectively applied to two sides of a torsion beam of the micro torsion mirror, and the phase difference between the driving signals on the two sides is 180 degrees.

10. The method for obtaining a capacitive feedback signal of a capacitive feedback micro torsion mirror according to claim 1, wherein, the pulse signals have pulses at a high level and intervals at a fixed low level.

11. The method for obtaining a capacitive feedback signal of a capacitive feedback micro torsion mirror according to claim 1, wherein, the pulse signals have pulses at a low level and intervals at a fixed high level.

12. The method for obtaining a capacitive feedback signal of a capacitive feedback micro torsion mirror according to claim 1, wherein, the driving signals drive all comb tooth pairs of the micro torsion mirror, and capacitive feedback signals are extracted from all the comb tooth pairs of the micro torsion mirror for feeding back capacitance variation.

13. A driving circuit for a capacitive feedback micro torsion mirror for implementing the method of claim 1, comprising a driving signal source, a capacitance detection circuit, an amplifier circuit and a signal extraction circuit;
the driving signal source has an output terminal connected to driving comb teeth of the capacitive feedback micro torsion mirror, so as to send driving signals to drive the capacitive feedback micro torsion mirror to vibrate; ensuring free torsion of the micro torsion mirror for at least 0.5 cycles during the interval of two sets of adjacent driving pulses;
the capacitance detection circuit has an input terminal connected to capacitive feedback comb teeth of the capacitive feedback micro torsion mirror, converts a capacitive signal into a voltage signal, and has an output terminal connected to an input terminal of the amplifier circuit, an output terminal of which is connected to an input terminal of the signal extraction circuit; and the signal extraction circuit extracts an amplified voltage signal during an interval of two adjacent sets of driving pulses.

14. The driving circuit for a capacitive feedback micro torsion mirror according to claim 13, wherein, the signal extraction circuit comprises a processor, which starts capture of the amplified voltage signal after a preset period t since the emission of a set of driving pulses, and stops the capture before the emission of a subsequent set of driving pulses, wherein the period t is greater than or equal to a duration of an interference signal actually observed;
or the signal extraction circuit comprises an analog-to-digital conversion circuit and a processor, the analog-to-digital conversion circuit collects an amplified voltage value derived from the capacitor feedback signal, and converts the voltage value into a digital signal format and outputs the digital signal to the processor; the processor starts processing of the digital signal after a preset period t since the emission of a set of driving pulses, and stops the processing before the emission of a subsequent set of driving pulses; wherein the period t is greater than or equal to a duration of an interference signal actually observed;
or the signal extraction circuit comprises a processor and a switch, the processor controls the switch to close, after a preset period t since the emission of a set of driving pulses, to allow the passage of the amplified voltage signal until a subsequent set of driving pulses is emitted, upon which the processor turns off the switch such that the amplified voltage signal is not allowed to pass, wherein the period t is greater than or equal to a duration of an interference signal actually observed.

* * * * *